United States Patent
Kanno et al.

(10) Patent No.: US 7,250,391 B2
(45) Date of Patent: Jul. 31, 2007

(54) CLEANING COMPOSITION FOR REMOVING RESISTS AND METHOD OF MANUFACTURING SEMICONDUCTOR DEVICE

(75) Inventors: Itaru Kanno, Hyogo (JP); Yasuhiro Asaoka, Hyogo (JP); Masahiko Higashi, Hyogo (JP); Yoshiharu Hidaka, Osaka (JP); Etsuro Kishio, Kyoto (JP); Tetsuo Aoyama, Kanagawa (JP); Tomoko Suzuki, Kanagawa (JP); Toshitaka Hiraga, Kanagawa (JP); Toshihiko Nagai, Kanagawa (JP)

(73) Assignees: Renesas Technology Corp., Tokyo (JP); Matsushita Electric Industrial Co., Ltd., Kadoma-Shi, Osaka (JP); EKC Technology K.K., Kawasaki-Shi, Kanagawa (JP)

( * ) Notice: Subject to any disclaimer, the term of this patent is extended or adjusted under 35 U.S.C. 154(b) by 106 days.

(21) Appl. No.: 10/617,128

(22) Filed: Jul. 11, 2003

(65) Prior Publication Data
US 2004/0106531 A1  Jun. 3, 2004

(30) Foreign Application Priority Data
Jul. 12, 2002 (JP) .............................. 2002-203987

(51) Int. Cl.
*C11D 7/50* (2006.01)
(52) U.S. Cl. ...................................... 510/175; 510/176
(58) Field of Classification Search ..................... None
See application file for complete search history.

(56) References Cited

U.S. PATENT DOCUMENTS

| | | | |
|---|---|---|---|
| 5,334,332 A | 8/1994 | Lee | |
| 5,698,503 A | 12/1997 | Ward et al. | |
| 5,750,309 A | 5/1998 | Hatakeyama et al. | |
| 5,792,274 A | 8/1998 | Tanabe et al. | |
| 5,972,862 A | 10/1999 | Torii et al. | |
| 6,248,704 B1 | 6/2001 | Small et al. | |
| 6,265,309 B1 | 7/2001 | Gotoh et al. | |
| 6,323,169 B1 | 11/2001 | Abe et al. | |
| 6,361,712 B1 | 3/2002 | Honda et al. | |
| 6,462,005 B1 | 10/2002 | Gotoh et al. | |
| 6,514,352 B2 * | 2/2003 | Gotoh et al. ................... | 134/3 |
| 2002/0146647 A1 | 10/2002 | Aoki et al. | |
| 2003/0004075 A1 | 1/2003 | Suto et al. | |
| 2003/0114014 A1 | 6/2003 | Yokoi et al. | |
| 2003/0138737 A1 | 7/2003 | Wakiya et al. | |

FOREIGN PATENT DOCUMENTS

CN       1402090       3/2003

(Continued)

*Primary Examiner*—Gregory Webb
(74) *Attorney, Agent, or Firm*—Leydig, Voit & Mayer, Ltd.

(57) ABSTRACT

The cleaning composition for removing resists includes a salt of hydrofluoric acid and a base not containing a metal (A component), a water-soluble organic solvent (B1 component), at least one organic acid or inorganic acid (C component), water (D component), and, optionally, an ammonium salt (E1 component), and having a pH 4-8. Thus, in manufacturing a semiconductor device, such as a copper interconnecting process, efficiency of removing resist residue and other etching residue after etching or ashing is improved, and corrosion resistance of a copper and an insulating film is also improved.

9 Claims, 6 Drawing Sheets

FOREIGN PATENT DOCUMENTS

| | | |
|---|---|---|
| CN | 1428659 | 7/2003 |
| JP | 7-201794 | 8/1995 |
| JP | 7-247498 | 9/1995 |
| JP | 8-202052 | 8/1996 |
| JP | 9-197681 | 7/1997 |
| JP | 10-55993 | 2/1998 |
| JP | 11-271985 | 10/1999 |
| JP | 2001-83712 | 3/2001 |
| JP | 2001-83713 | 3/2001 |
| WO | WO 02/19406 | 3/2002 |
| WO | WO 02/33033 A1 | 4/2002 |

* cited by examiner

CLEANING COMPOSITION FOR REMOVING RESISTS AND METHOD OF MANUFACTURING SEMICONDUCTOR DEVICE

BACKGROUND OF THE INVENTION

1. Field of the Invention

The present invention relates to a cleaning composition for stripping and removing a resist film, resist residue, and other reaction residue left by an etching gas (i.e., etching residue) that remain on a semiconductor substrate after dry etching in forming a metal interconnection having copper as its main component, and a method of manufacturing a semiconductor device using the same.

2. Description of the Background Art

Generally, in a process of manufacturing a highly integrated semiconductor elements, a resist film is first applied on an interconnection material such as a metal film which becomes an interconnection for electric conduction, and on an interlayer insulating film material which ensures insulation between interconnections. A desired resist pattern is formed by photolithography, and dry etching is conducted using the resist film as a mask, and then the remaining resist film is removed. To remove the resist film, it is common to perform wet treatment after plasma ashing, to strip and remove resist residue remaining on the interconnection material and the interlayer insulating material using a cleaning composition.

With an aluminum-based interconnection material conventionally used, examples of the cleaning composition therefor include: fluorine type compound-based cleaning compositions (Japanese Patent Laying-Open Nos. 7-201794, 8-202052, 11-271985), a cleaning composition containing hydroxylamine (U.S. Pat. No. 5,334,332), and a cleaning composition containing quaternary ammonium hydroxide (Japanese Patent Laying-Open No. 7-247498).

With advancement of downsizing and speeding of semiconductor elements in recent years, however, the manufacturing process of the semiconductor devices has been changed considerably. For example, to fulfill the demand for speeding of the semiconductor elements, Al or Al alloy conventionally used as the interconnection material has been replaced with Cu or Cu alloy having lower electric resistance than Al or Al alloy, and p-TEOS (Tetra Ethyl Ortho Silicate) film or the like conventionally used as the interlayer insulating film has been replaced with a so-called Low-k film having a lower dielectric constant than the p-TEOS film. Examples of the Low-k film currently regarded as promising include: a film formed of inorganic material such as porous silica or the like, a film formed of organic material such as polyimide, polyarylene or the like, and a film formed of a mixture of the above-mentioned inorganic and organic materials.

Further, with advancement of downsizing, an i-line resist conventionally used in the photolithographic process has been replaced with a chemically amplified excimer resist, such as KrF excimer resist, ArF excimer resist or the like, and a highly efficient cleaning composition corresponding thereto has been demanded.

Problems of the conventional cleaning composition and the method of manufacturing a semiconductor device using the same are now described with reference to FIGS. 3A-3K.

An element such as a transistor (not shown) is formed on a semiconductor substrate. Referring to FIG. 3A, a first copper interconnection 1 of an embedded type is formed in a first insulating film 2 using a known damascene process. A silicon nitride film 3 as a protective film of the copper interconnection and a Low-k film 4 as an interlayer insulating film of a low dielectric constant are successively formed thereon, and a resist film 5 patterned to a prescribed shape is formed further thereon. Here, a chemically amplified excimer resist corresponding to, e.g., KrF excimer laser exposure or ArF excimer laser exposure is employed as the resist material.

Next, referring to FIG. 3B, Low-k film 4 is dry etched, using resist film 5 as a mask, to expose silicon nitride film 3, so that a via hole 21 is formed. At this time, reactive products of the gas used for the dry etching and the Low-k film and the resist film accumulate in via hole 21 as resist residue 6.

Next, referring to FIGS. 3B and 3C, resist film 5 is removed by plasma ashing. At this time, a modified film 7 is formed at the surface of Low-k film 4 according to the reaction of heat and plasma during ashing.

Next, referring to FIGS. 3C and 3D, resist residue 6 is removed by processing with a conventional fluorine type compound-based cleaning composition. Any remaining resist residue would cause electrically loose connection with an upper interconnection to be formed afterward. Thus, to ensure the removal of the resist residue, the cleaning composition likely to etch even the insulating film has been used. As a result, modified layer 7 at the surface of the Low-k film as well as the Low-k film 4 itself have been etched, resulting in via hole 21 of an enlarged internal diameter.

Thereafter, referring to FIG. 3E, a resist film 5 patterned for trench formation is formed on Low-k film 4 to form an interconnection to be connected with via hole 21.

Next, referring to FIG. 3F, Low-k film 4 is dry etched, using resist film 5 as a mask, down to its intermediate position to form a trench 22. At this time, resist residue 6, being a reaction product of the gas used for the dry etching, and the Low-k film, accumulates in via hole 21 and trench 22.

Next, referring to FIGS. 3F and 3G, resist film 5 is removed by plasma ashing. At this time, a modified layer 7 is formed at the surface of Low-k film 4 according to the reaction of heat and plasma during ashing.

Next, referring to FIGS. 3G and 3H, resist residue 6 is removed by processing with a conventional fluorine type compound-based cleaning composition. The conventional cleaning composition removes the resist residue and also etches modified layer 7 at the surface of the Low-k film, so that the internal diameter of via hole 21 is enlarged and the width of trench 22 increases.

Next, referring to FIG. 3I, silicon nitride film 3 is removed by dry etching to expose first copper interconnection 1. At this time, etching residue 8 accumulates in via hole 21.

Next, referring to FIG. 3J, the surface of the copper interconnection is cleaned with the cleaning composition. With the conventional fluorine type compound-based cleaning composition, first copper interconnection 1 would be corroded if the removing action of resist residue and other etching residue is enhanced. Thus, a copper corrosion inhibitor such as benzotriazole (BTA) has been added to prevent corrosion of the first copper interconnection (Japanese Patent Laying-Open No. 2001-83712). With such a cleaning composition, however, there is a problem that the copper corrosion preventing effect would be degraded when it is attempted to further improve the resist residue removing action.

Next, referring to FIG. 3K, copper is filled in via hole 21 and trench 22 by plating or the like. A second copper interconnection 10 is then formed by CMP (Chemical Mechanical Polishing). If the first copper interconnection 1 has been corroded by the conventional cleaning composition, however, the second copper interconnection 10 cannot fill via hole 21 completely. In such a case, junction resistance between the first copper interconnection 1 and the second copper interconnection 10 becomes high, or they may even be disconnected.

An interval 11 between the interconnections has become narrow with downsizing of the elements. If the conventional cleaning composition is used for the above-described process, modified layer 7 at the surface of the Low-k film as well as the Low-k film 4 itself would be etched to further narrow the interval 11 between the interconnections. This would cause degradation in characteristics, such as a decrease of operating speed of a semiconductor element due to increased electric capacitance between the interconnections, or a defect such as a short-circuit between the interconnections. Further, with the conventional cleaning composition, complete removal of resist residue as well as corrosion control of both copper and the Low-k film are not obtained.

SUMMARY OF THE INVENTION

An object of the present invention is to provide a cleaning composition for removing resists which can be used under safe and temperate conditions when removing resist film and etching residue after dry etching and when removing resist residue and etching residue after ashing in a copper interconnecting process and which exhibits excellent removing efficiency thereof and also excellent corrosion preventing effects on copper and interlayer insulating film, and to provide a manufacturing method of a semiconductor device using the same.

To achieve the above object, a cleaning composition for removing resists according to the present invention is characterized in that it includes a salt of hydrofluoric acid and a base not containing a metal (A component), a water-soluble organic solvent (B1 component), at least one acid selected from a group consisting of organic acid and inorganic acid (C component), and water (D component), and its hydrogen ion concentration (pH) is 4-8. The cleaning composition for removing resists of the present invention may further include an ammonium salt (E1 component) in addition to the above-described A, B1, C and D components.

Another cleaning composition for removing resists according to the present invention is characterized in that it includes a salt of hydrofluoric acid and a base not containing a metal (A component), a water-soluble organic solvent (B2 component), phosphonic acid (C1 component), water (D) component), and a base not containing a metal (E component), and its hydrogen ion concentration (pH) is 2-8. The cleaning composition for removing resists of the present invention may further include a Cu corrosion inhibitor (F component) in addition to the above-described A, B2, C1, D and E components.

Further, a manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by way of dry etching using the resist film as a mask, the step of removing the resist by gas plasma processing or heat treatment, and the step of removing, using the cleaning composition for removing resists as described above, resist residue generated due to reaction between etching gas and the resist film and the insulating film at the time of dry etching. The etching gas used in the present invention includes fluorocarbon as its main component, and the resist residue generated according to the reaction between the etching gas and the resist film and the insulating film such as the Low-k film includes resist residue, carbon residue and a composite thereof Further, another manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by performing dry etching with the resist film as a mask, and the step of removing, using the cleaning composition for removing resists as described above, the remaining resist film and resist residue generated due to reaction between etching gas and the resist film and the insulating film at the time of dry etching.

As such, the cleaning composition for removing resists according to the present invention exhibits excellent removing efficiency of the resist residue and excellent corrosion-proof effects on the copper interconnection film and the insulating film. Accordingly, it is possible, during the manufacture of the semiconductor device, to prevent narrowing of an interval between the copper interconnections, degradation in characteristics such as a decrease of driving speed of semiconductor elements, and a defect such as short-circuit between the interconnections.

Further, yet another manufacturing method of a semiconductor device according to the present invention includes the step of forming a metal film having copper as its main component on a semiconductor substrate, the step of forming an insulating film thereon, the step of providing a hole in the insulating film reaching the metal film by dry etching, and the step of removing, using the cleaning composition for removing resists as described above, etching residue generated due to reaction between etching gas and the insulating film during the dry etching.

The etching gas used in the present invention includes fluorocarbon as its main component, and thus, the main component of the etching residue produced according to the reaction between the dry etching gas and the insulating film or the metal film including copper as its main component, is carbon residue. The cleaning composition for removing resists according to the present invention is capable of removing not only the resist and the resist residue but also the etching residue not including the resist or the resist residue.

Herein, the metal having copper as its main component means that the content of copper within the relevant metal is, e.g., at least 90 mass %.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
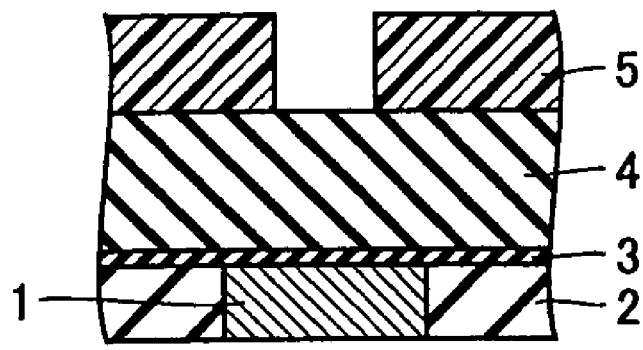
FIGS. 1A-1K are cross sectional views illustrating successive steps in an embodiment of a copper interconnecting process employing the cleaning composition of the present invention.

A cleaning composition for removing resists (hereinafter, also referred to as the "resist removing cleaner") according to the present invention includes a salt of hydrofluoric acid and a base not containing a metal (A component), a water-soluble organic solvent (B1 component), at least one acid selected from a group consisting of organic acid and inorganic acid (C component), and water (D component), and has hydrogen ion concentration (pH) of 4-8.

The A component in the present invention is the salt of hydrofluoric acid and a base which does not contain a metal. As the base which does not contain a metal, organic amine compounds, such as hydroxy amines, primary, secondary or tertiary fatty amine, alicyclic amine, heterocycle amine and aromatic amine, ammonia, lower quaternary ammonium base and others are preferably used.

The hydroxy amines include hydroxylamine, N-methyl hydroxylamine, N,N-dimethyl hydroxylamine, N,N-diethyl hydroxylamine and others.

The primary fatty amine includes methylamine, ethylamine, propyl amine, butyl amine, monoethanolamine, monoisopropanolamine, 2-(2-aminoethylamino) ethanol and others. The secondary fatty amine includes dimethylamine, diethylamine, dipropyl amine, dibutyl amine, diethanolamine, N-methyl ethanolamine, N-ethyl ethanolamine and others. The tertiary fatty amine includes trimethylamine, triethylamine, tripropyl amine, tributyl amine, N,N-dimethylethanolamine, N,N-diethyl ethanolamine, N-methyldiethanolamine, N-ethyl diethanolamine, triethanolamine and others.

The alicyclic amine includes cyclohexylamine, dicyclohexylamine and others. The heterocycle amine includes pyrrole, pyrrolidine, pyridine, morpholine, pyrazine, piperidine, oxazole, thiazole and others. The aromatic amine includes benzylamine, dibenzylamine, N-methyl benzylamine, N-ethyl benzylamine and others. The lower quaternary ammonium base includes tetramethyl ammonium hydroxide, (2-hydroxy ethyl) trimethyl ammonium hydroxide and others.

Preferable among the bases listed above are ammonia, monoethanolamine, tetramethyl ammonium hydroxide and others, of which ammonia is particularly preferable.

The A component described above improves removing efficiency of the chemically amplified excimer resist after dry etching, by reacting with an agent for generating acid with light that is included in the chemically amplified excimer resist. In addition, the A component remarkably improves removing efficiency of the resist residue after ashing, by promoting cleavage of chemical bonds within the resist residue.

Further, the content of the A component is from 0.01 mass % to 1 mass %, and preferably from 0.05 mass % to 0.5 mass %. If it is less than 0.01 mass %, the stripping efficiency of the resist film, resist residue and other etching residue would be degraded. If it exceeds 1 mass %, corrosion of the copper interconnection and the interlayer insulating film such as Low-k film would become undesirably intense.

The B1 component in the present invention is a water-soluble organic solvent. Although not limited specifically, amides, polyhydric alcohol or its derivatives and others are preferably used. The amides include formamide, N-methyl formamide, N,N-dimethyl formamide, N-ethyl formamide, N,N-diethyl formamide, acetamide, N-methyl acetamide, N,N-dimethyl acetamide, N-ethyl acetamide, N,N-diethyl acetamide and others.

The polyhydric alcohol or its derivatives include ethylene glycol, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol, diethylene glycol monomethyl ether, diethylene glycol monoethyl ether, diethylene glycol monopropyl ether, diethylene. glycol monobutyl ether, diethylene glycol monomethyl ether acetate, diethylene glycol monoethyl ether acetate, diethylene glycol monopropyl ether acetate, diethylene glycol monobuthyl ether acetate, triethylene glycol monomethyl ether, propylene glycol, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, dipropylene glycol monomethyl ether acetate, dipropylene glycol monoethyl ether acetate, dipropylene glycol monopropyl ether acetate, dipropylene glycol monobutyl ether acetate, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether, dipropylene glycol dibuthyl ether, and others.

Further, it is preferable to use a mixture of the amides and the polyhydric alcohol or its derivatives described above as the B1 component of the present invention. Although the mixed mass ratio of amides and polyhydric alcohol or its derivatives is not limited specifically, the following can be said from the standpoint of removing efficiency of the chemically amplified excimer resist after dry etching. That is, when removing the KrF resist (resist for KrF excimer laser), since its main framework is poly hydroxy styrene of a phenol framework, it is preferable to have a higher ratio of amides that are highly soluble thereto. By comparison, when removing the ArF resist (resist for ArF excimer laser) whose main framework is acrylic, it is preferable to have a higher ratio of polyhydric alcohol or its derivatives that are highly soluble thereto. The same standpoint applies to the resist residue after dry etching and ashing. In other words, the mixed mass ratio of amides and polyhydric alcohol or its derivatives may be determined according to the kind of resist to be used before dry etching.

In particular, it is advantageous to use the mixture of amides and polyhydric alcohol or its derivatives as the Bl component in the case where the ArF resist and the KrF resist are employed together in manufacture of one and the same semiconductor device. In such a case, it is particularly preferable, from the standpoint of solubility of both resists, that the mixed mass ratio of amides in the B1 component is 0.3-0.5.

The content of the B1 component is preferably from 50 mass % to 98 mass %, and more preferably from 60 mass % to 95 mass %. If it is less than 50 mass %, removing efficiency of the resist film and the resist residue would be degraded and corrosion of the copper interconnection would become intense. On the other hand, if it exceeds 98 mass %, again, the removing efficiency of the resist film and the resist residue would be degraded undesirably.

As the C component of the present invention, at least one acid selected from the group consisting of organic acid and inorganic acid is used. The organic acid includes aliphatic acids such as formic acid, acetic acid, propionic acid, butyric acid, oxalic acid, glycolic acid, tartaric acid and citric acid, and aromatic acids such as benzoic acid, toluic acid and phthalic acid, and others. The inorganic acid includes sulfuric acid, hydrochloric acid, nitric acid, phosphoric acid and others. The C component is used to adjust pH (hydrogen ion concentration) of the resist removing cleaner, and the added amount is not restricted specifically.

The pH of the resist removing cleaner according to the present invention is 4-8, preferably 5.5-7.5, and more preferably 6.5-7.5. In the present invention, pH of the cleaning composition has very important effects. If pH is less than 4, the copper-based metal film would heavily corrode. If pH exceeds 8, removing efficiency of the resist film, resist residue and other etching residue would be degraded, and corrosion of the copper-based metal film and the Low-k film would advance undesirably.

Water is used as the D component in the present invention. Water serves to ionize the salt of the hydrofluoric acid and the base not containing metal as the A component, improve removing efficiency of the resist residue and other etching residue, and also raise the flash point of the cleaning composition to facilitate handling thereof.

Second Embodiment

Another cleaning composition for removing resists according to the present invention includes a salt of hydrofluoric acid and a base not containing a metal (A component), a water-soluble organic solvent (B1 component), at least one acid selected from a group consisting of organic acid and inorganic acid (C component), water (D component) and an ammonium salt (E1 component), and has hydrogen ion concentration (pH) of 4-8. That is, the present invention includes the E1 component in addition to the A, B1, C and D components of the cleaning composition for removing resists of the first embodiment, and has its pH adjusted to 4-8.

The ammonium salt (E1 component) serves to suppress corrosion of the insulating film. The content of the E1 component is preferably 0.01-5 mass %, and more preferably 0.05-3 mass %. If it is less than 0.01 mass %, corrosion of the insulating film such as TEOS, SiN, SiON, $SiO_2$ would become intense. If it exceeds 5 mass %, removing efficiency of the resist film, resist residue and others would be degraded.

As the E1 component of the present invention, any ammonium salt may be used without restriction. It includes: aliphatic monocarboxylic acid ammonium salt such as ammonium formate, ammonium acetate, ammonium propionate, and ammonium butyrate; aliphatic polycarboxylic acid ammonium salt such as ammonium glycolate, ammonium oxalate, ammonium malonate, ammonium succinate, ammonium maleate, ammonium glutanate, and ammonium adipinate; oxycarboxylic acid ammonium salt such as ammonium lactate, ammonium gluconate, ammonium tartrate, ammonium malate, and ammonium citrate; and amino phosphonic acid ammonium salt such as ammonium sulfamate.

Third Embodiment

Yet another cleaning composition for removing resists according to the present invention includes a salt of hydrofluoric acid and a base not containing a metal (A component), a water-soluble organic solvent (B2 component), phosphonic acid (C1 component), water (I) component), and a base not containing a metal (E component), and its hydrogen ion concentration (pH) is 2-8. Adding the phosphonic acid (C1 component) and the base not containing a metal (E component) improves the corrosion-proof effect on a copper-based metal film, and hence enables use of the resist removing cleaner of a wider pH range (pH: 2-8).

The A component of the present invention is the salt of hydrofluoric acid and a base which does not contain a metal, of which details have been described above in the first embodiment.

The B2 component of the present invention is the water-soluble organic solvent. Although not limited specifically, amides, pyrrolidones, alkyl ureas, sulfoxides, sulfones, imidazolydinones, polyhydric alcohol or its derivatives, lactones, carboxylic acid derivatives and others are preferably used.

The amides include formamide, N-methyl formamide, N,N-dimethyl formamide, N-ethyl formamide, N,N-diethyl formamide, acetamide, N-methyl acetamide, N,N-dimethyl acetamide, N-ethyl acetamide, N,N-diethyl acetamide and others. The pyrrolidones include N-methyl-2-pyrrolidone, N-ethyl-2-pyrrolidone, N-cyclohexyl-2-pyrrolidone, N-hydroxyethyl-2-pyrrolidone and others. The alkyl ureas include tetramethyl urea, tetraethyl urea and others. The sulfoxides include dimethyl sulfoxide, diethyl sulfoxide and others. The sulfones include dimethyl sulfone, diethyl sulfone, bis (2-hydroxyethyl) sulfone, tetramethylene sulfone and others. The imidazolydinones include 1,3-dimethyl-2-imidazolydinone, 1,3-diethyl-2-imidazolydinone and others.

The polyhydric alcohol or its derivatives include ethylene glycol, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol, diethylene glycol monomethyl ether, diethylene glycol monoethyl ether, diethylene glycol monopropyl ether, diethylene glycol monobutyl ether, diethylene glycol monomethyl ether acetate, diethylene glycol monoethyl ether acetate, diethylene glycol monopropyl ether acetate, diethylene glycol monobuthyl ether acetate, triethylene glycol monomethyl ether, propylene glycol, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, dipropylene glycol monomethyl ether acetate, dipropylene glycol monoethyl ether acetate, dipropylene glycol monopropyl ether acetate, dipropylene glycol monobutyl ether acetate, diethylene glycol dimethyl ether, diethylene glycol diethyl ether, diethylene glycol dipropyl ether, dietylene glycol dibutyl ether, dipropylene glycol dimethyl ether, dipropylene glycol diethyl ether, dipropylene glycol dipropyl ether, dipropylene glycol dibuthyl ether, and others.

The lactones include γ-butyrolactone, σ-valerolactone and others. The carboxylic acid derivatives include methyl acetate, ethyl acetate, methyl lactate, ethyl lactate and others.

It is preferable to use a mixture of a sulfur-containing compound such as the sulfoxides or sulfones and the polyhydric alcohol or its derivative described above as the B2 component of the present invention. Although the mixed mass ratio of the sulfur-containing compound and the polyhydric alcohol or its derivative is not limited specifically, the following can be said from the standpoint of removing efficiency of the chemically amplified excimer resist after dry etching. That is, when removing the KrF resist, since its main framework is poly hydroxy styrene of a phenol framework, it is preferable to have a higher ratio of the sulfur-containing compound highly soluble thereto. By comparison, when removing the ArF resist whose main framework is acrylic, it is preferable to have a higher ratio of the polyhydric alcohol or its derivative highly soluble thereto. The same standpoint applies to the resist residue after dry etching and ashing. In other words, the mixed mass ratio of sulfur-containing compound and polyhydric alcohol or its derivative may be determined according to the kind of resist to be used before dry etching.

The content of the B2 component is preferably from 50 mass % to 95 mass %, and more preferably from 55 mass % to 90 mass %. If it is less than 50 mass %, removing efficiency of the resist film and the resist residue would be degraded and corrosion of the copper interconnection would become intense. On the other hand, if it exceeds 95 mass %, again, the removing efficiency of the resist film and the resist residue would be degraded undesirably.

The C1 component of the present invention is the phosphonic acid. Examples of the phosphonic acid used in the present invention include: diethylene triamine penta (methylene phosphonic acid), phenyl phosphonic acid, methylene diphosphonic acid, ethylidene diphosphonic acid, 1-hydroxyl ethylidene-1,1-diphosphonic acid, 1-hydroxyl propylidene-1,1-diphosphonic acid, 1-hydroxyl butylidene-1,1-diphosphonic acid, ethyl amino bis (methylene phosphonic acid), dodecyl amino bis (methylene phosphonic acid), ethylene diamine bin (methylene phosphonic acid), ethylene diamine tetrakis (methylene phosphonic acid), hexamethylene diamine tetrakis (methylene phosphonic acid), isopropylene diamine bis (methylene phosphonic acid), isopropylene diamine tetra (methylene phosphonic acid), nitrilo tris (methylene phosphonic acid), and others.

The phosphonic acid (C1 component) used in the present invention, when used together with the base not containing a metal (E component), serves as a corrosion inhibitor for the copper-based metal film as the interconnection material or the insulating film such as the Low-k film, and also serves as a pH adjuster. Here, the content of the C1 component is preferably from 0.1 mass % to 20 mass %, and more preferably from 0.5 mass % to 15 mass %. If it is less than 0.1 mass %, the corrosion-proof effect on the copper-based metal film or the Low-k film would be degraded. If it exceeds 20 mass %, the removing efficiency of the resist film, resist residue or etching residue would be degraded undesirably.

Water is used as the D component in the present invention, of which details are as described in the first embodiment.

The E component of the present invention is the base which does not contain a metal. Although the base not containing a metal used in the present invention is not limited specifically, organic amine compounds, such as hydroxy amines, primary, secondary or tertiary fatty amine, alicyclic amine, heterocycle amine and aromatic amine, ammonia, lower quaternary ammonium base and others are preferably used.

The hydxoxy amines include hydroxylamine, N-methyl hydroxylamine, N,N-dimethyl hydroxylamine, N,N-diethyl hydroxylamine and others.

The primary fatty amine includes methylamine, ethylamine, propyl amine, butyl amine, monoethanolamine, monoisopropanolamine, 2-(2-aminoethylamino) ethanol and others. The secondary fatty amine includes dimethylamine, diethylamine, dipropyl amine, dibutyl amine, diethanolamine, N-methyl ethanolamine, N-ethyl ethanolamine and others. The tertiary fatty amine includes trimethylamine, triethylamine, tripropyl amine, tributyl amine, N,N-dimethylethanolamine, N,N-diethylethanolamine, N-methylcdiethanolamine, N-ethyldiethanolamine, triethanolamine and others.

The alicyclic amine includes cyclohexylamine, dicyclohexylamine and others. The heterocycle amine includes pyrrole, pyrrolidine, pyridine, morpholine, pyrazine, piperidine, oxazole, thiazole and others. The aromatic amine includes benzylamine, dibenzylamine, N-methyl benzylamine, N-ethyl benzylamine and others. The lower quaternary ammonium base includes tetramethyl ammonium hydroxide, (2-hydroxy ethyl) trimethyl ammonium hydroxide and others.

The base not containing a metal (E component) used in the present invention, when used together with the phosphonic acid (C1 component), serves as a corrosion inhibitor for the copper-based metal film as the interconnection material or the insulating film such as the Low-k film, and also serves as a pH adjuster. Here, the content of the E component is preferably from 0.1 mass % to 20 mass %, and more preferably from 0.5 mass % to 15 mass %. If it is less than 0.1 mass %, corrosion of the copper-based metal film and the Low-k film would become intense. If it exceeds 20 mass %, the removing efficiency of the resist film, resist residue and other etching residue would be degraded undesirably.

The pH of the resist removing cleaner according to the present invention is 2-8, and preferably 2.5-7.5. If pH is less than 2, the copper-based metal film would heavily corrode. If pH exceeds 8, the removing efficiency of the resist film, resist residue and other etching residue would be degraded, and corrosion of the copper-based metal film and the Low-k film would advance undesirably. In the present embodiment, addition of the phosphonic acid (C1 component) and the base not containing a metal (E component) improves the corrosion-proof effect on a metal film, and hence enables use of the resist removing cleaner of a wider pH range (pH: 2-8) than the pH range (pH: 4-8) of the resist removing cleaners of the first and second embodiments.

Fourth Embodiment

A still further cleaning composition for removing resists according to the present invention includes a salt of hydrofluoric acid and a base not containing a metal (A component), a water-soluble organic solvent (B2 component), phosphonic acid (C1 component), water (D component), a base not containing a metal (E component), and a Cu corrosion inhibitor (F component), and its hydrogen ion concentration (pH) is 2-8. That is, the present embodiment further includes the F component in addition to the A, B2, C1, D and E components of the resist removing cleaner of the third embodiment, and the pH is adjusted to 2-8.

Here, the Cu corrosion inhibitor (F component) serves to suppress corrosion of a copper-based metal film, and its content is preferably from 0.01 mass % to 5 mass %, and more preferably from 0.05 mass % to 3 mass %. If it is less than 0.01 mass %, corrosion of the copper-based metal film would become intense. If it exceeds 5 mass %, the removing efficiency of the resist film, resist residue and others would be degraded.

As the F component of the present invention, triazoles, aliphatic carboxylic acids, aromatic carboxylic acids or amino carboxylic acids are preferably used, or two or more kinds thereof may be employed together. The triazoles include benzotriazole, o-tolyltriazole, m-tolyltriazole, p-tolyltriazole, carboxy benzotriazole, 1-hydroxy benzotriazole, nitro benzotriazole, dihydroxy propyl benzotriazole, and others. The aliphatic carboxylic acids include oxalic acid, malonic acid, acrylic acid, methacrylic acid, maleic acid, fumaric acid, succinic acid, itaconic acid, glutaric acid, adipic acid, lactic acid, malic acid, citric acid, tartaric acid, and others. The aromatic carboxylic acids include benzoic acid, phthalic acid, trimellitic acid, pyromellitic acid, 5-sulfosalicylic acid, 2,4-dihydroxy benzoic acid, and others. The amino carboxylic acids include glycine, dihydroxy ethyl glycine, alanine, valine, leucine, asparagine, glutamine, aspartic acid, glutaric acid, lysine, arginine, imino diacetic acid, nitrilo triacetic acid, ethylenediamine tetraacetic acid, 1,2-cyclohexadiamine tetraacetic acid, diethylene triamine pentaacetic acid, and others.

Next, an embodiment of the manufacturing method of a semiconductor device, characterized by removing resist film, resist residue and other etching residue using the resist removing cleaner according to the present invention, is described taking a copper interconnecting process as an example.

Fifth Embodiment

Figure 1B:
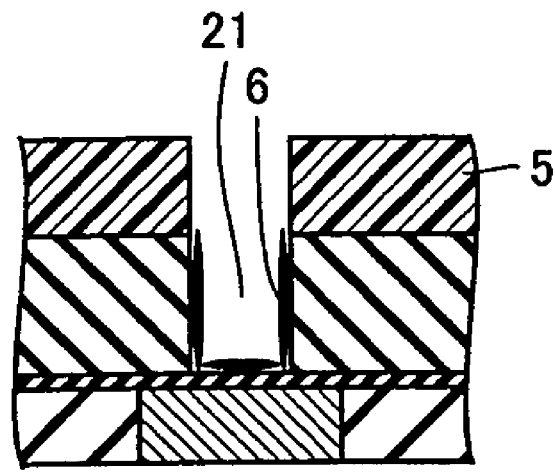
Figure 1C:
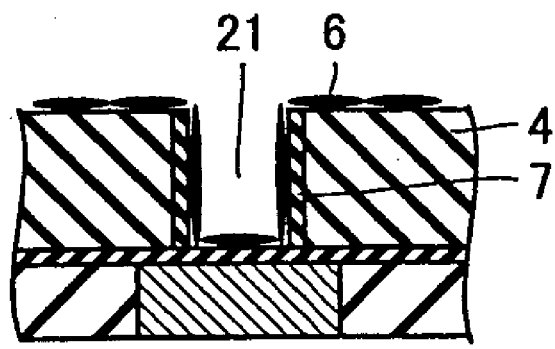
Figure 1D:
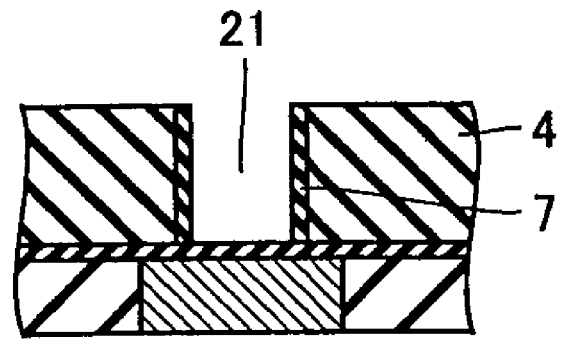
Figure 3A:
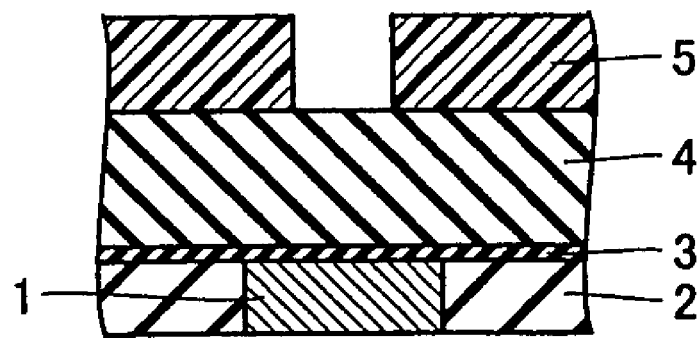
FIGS. 3A-3K are cross sectional views illustrating successive steps of a typical copper interconnecting process employing a conventional cleaning composition.
Figure 3B:
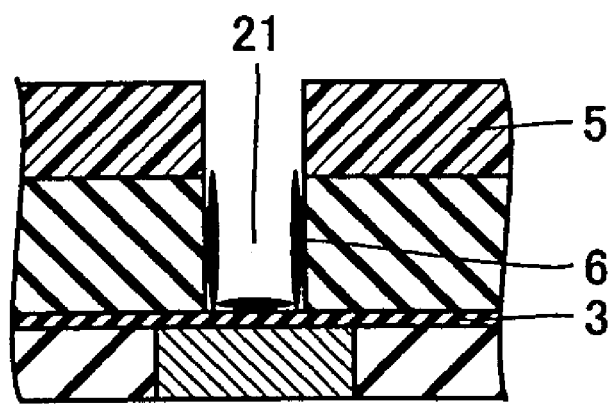
Figure 3C:
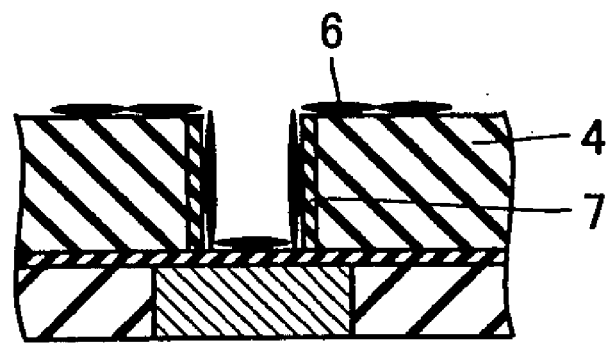
Figure 3D:
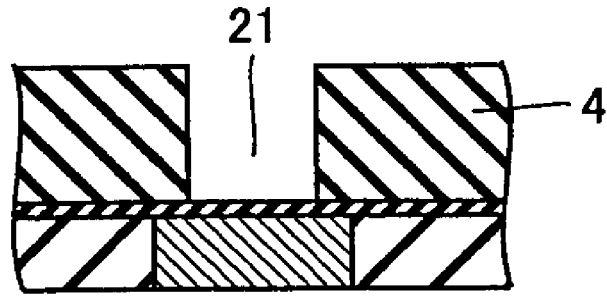

Hereinafter, an embodiment of the copper interconnecting process using the cleaning composition of the present invention is described with reference to FIGS. 1A-1K. The steps shown in FIGS. 1A-1C are the same as the conventional steps shown in FIGS. 3A-3C. Thereafter, referring to FIGS. 1C and 1D, resist residue 6 produced during formation of via hole 21 is removed using the cleaning composition of the present invention. Here, expansion of the internal diameter of via hole 21 is suppressed, since the cleaning composition of the present invention hardly etches Low-k film 4 and its modified film 7.

Figure 1E:
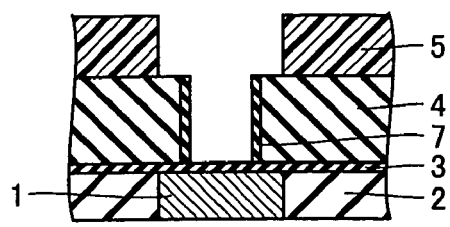
Figure 1F:
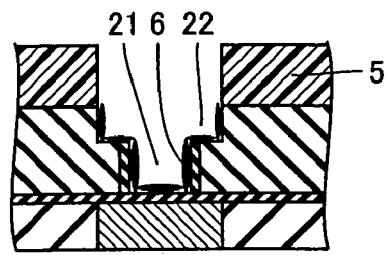
Figure 1G:
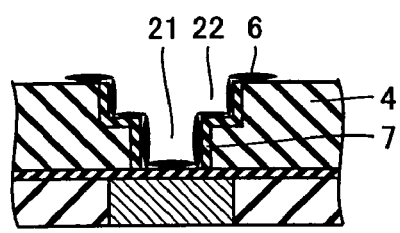
Figure 1H:
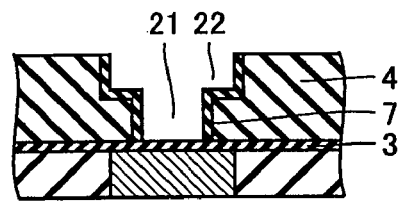
Figure 3E:
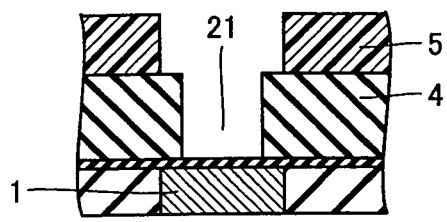
Figure 3F:
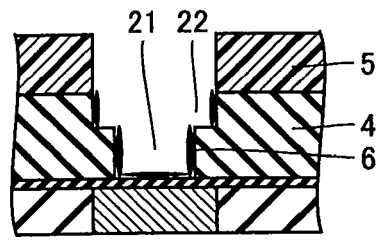
Figure 3G:
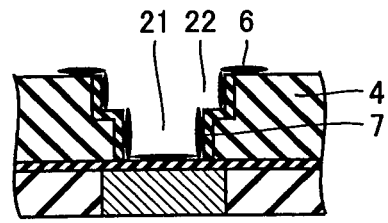
Figure 3H:
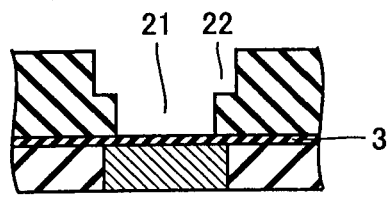
Figure 3I:
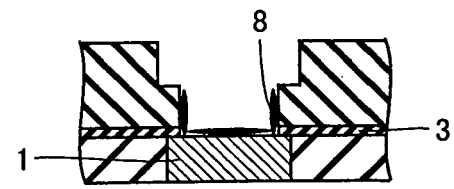
Figure 3J:
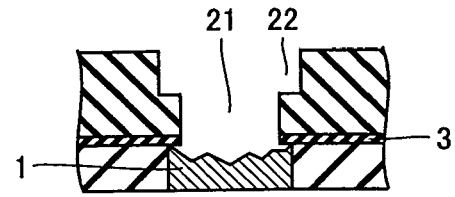
Figure 3K:
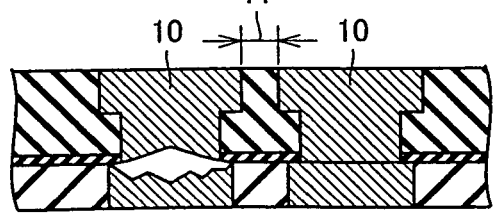

The steps shown in FIGS. 1E-1G are the same as the conventional steps shown in FIGS. 3E-3G. Next, referring to FIGS. 1G and 1H, the resist residue produced during formation of trench 22 is removed using the cleaning composition of the present invention. Here, again, the internal diameter of the via hole and the width of the trench are prevented from increasing, since the cleaning composition of the present invention barely etches Low-k film 4 and its modified film 7.

Figure 1I:
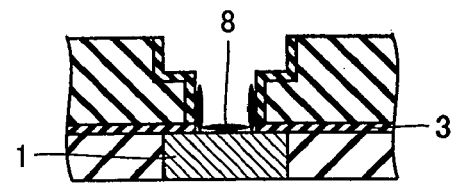

Thereafter, referring to FIG. 1I, silicone nitride film 3 is removed by dry etching to expose first copper interconnection 1. At this time, etching residue 8 produced according to the reaction of etching gas and the silicone nitride accumulates on the surface of first copper interconnection 1. Next, referring to FIGS. 1I and 1J, the surface of first copper interconnection 1 is cleaned using the cleaning composition of the present invention. At this time, unlike the conventional cleaning composition, the cleaning composition of the present invention does not corrode the surface of first copper interconnection 1. Next, referring to FIGS. 1J and 1K, copper is filled in via hole 21 and trench 22 by, e.g., reflow sputtering or MOCVD (Metal Organic Chemical Vapor Deposition) that is CVD (Chemical Vapor Deposition) employing an organic metal compound. An unnecessary portion thereof is removed by CMP, so that a second copper interconnection 10 is formed. The cleaning composition of the present invention does not cause corrosion of the surface of first copper interconnection 1. This ensures favorable junction between first copper interconnection 1 and second copper interconnection 10, without a problem of increased junction resistance or disconnection. Further, the interval 11 between the copper interconnections is prevented from narrowing, since the cleaning composition of the present invention hardly etches Low-k film 4 and its modified layer 7. Accordingly, the problems such as degradation in characteristics of semiconductor elements and short-circuit between interconnections are avoided.

Sixth Embodiment

Figure 2A:
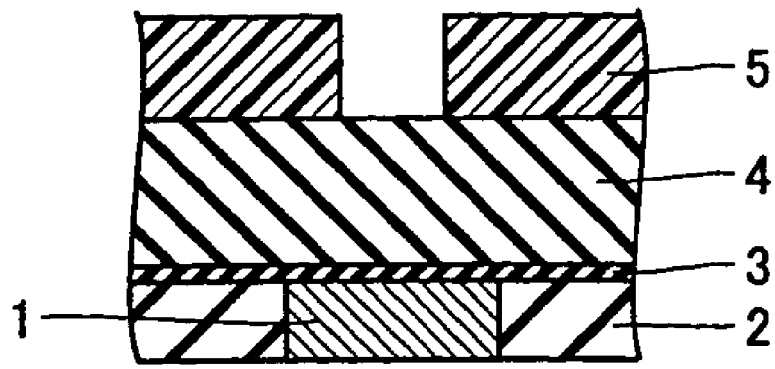
FIGS. 2A-2I are cross sectional views illustrating successive steps in another embodiment of the copper interconnecting process employing the cleaning composition of the present invention.
Figure 2B:
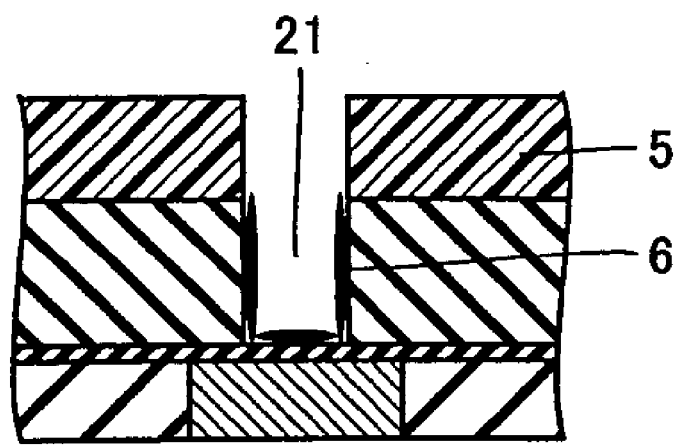
Figure 2C:
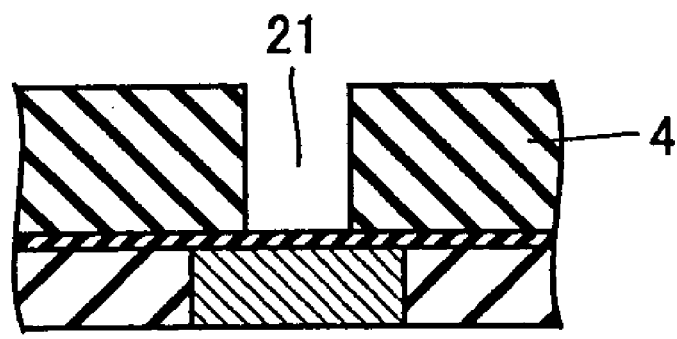

Hereinafter, another embodiment of the copper interconnecting process using the cleaning composition of the present invention is described with reference to FIGS. 2A-2I. The steps shown in FIGS. 2A and 2B are the same as the conventional steps shown in FIGS. 3A and 3B. Referring to FIGS. 2B and 2C, after dry etching of via hole 21, in a state where resist film 5 is being left with plasma ashing unperformed or otherwise performed insufficiently, resist film 5 and resist residue 6 are removed using the cleaning composition of the present invention. The present embodiment is advantageous in that a modified layer is not formed at the surface of Low-k film 4.

Figure 2D:
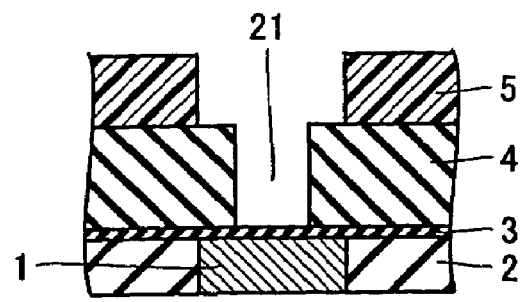
Figure 2E:
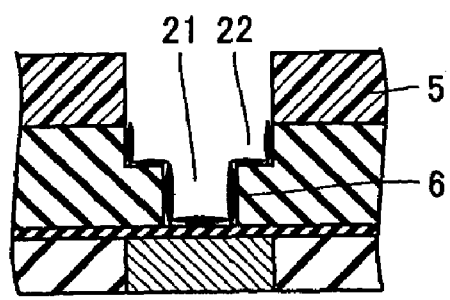
Figure 2F:
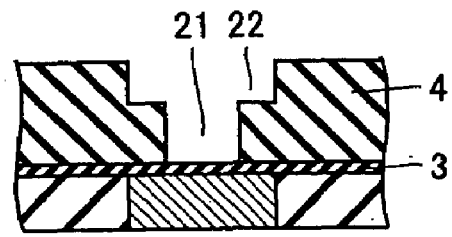

The steps shown in FIGS. 2D and 2E are the same as the conventional steps shown in FIGS. 3E and 3F. Referring to FIGS. 2E and 2F, after dry etching of the trench, in a state where resist film 5 is being left with plasma ashing unperformed or otherwise performed insufficiently, resist film 5 and resist residue 6 are removed using the cleaning composition of the present invention. Here, again, a modified layer is not formed at the surface of Low-k film 4.

Figure 2G:
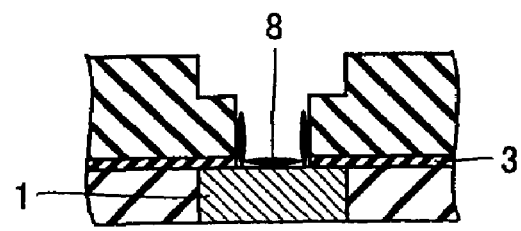
Figure 2H:
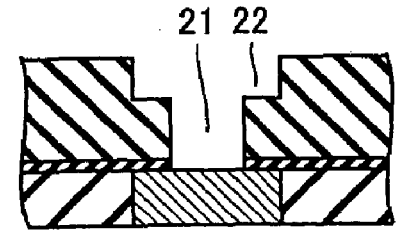
Figure 2I:
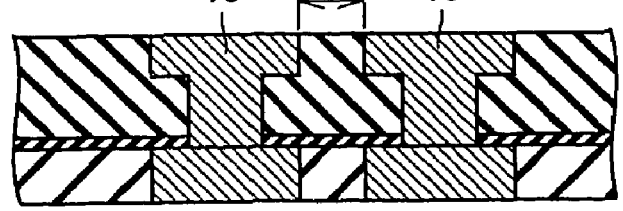

Thereafter, referring to FIG. 2G, silicon nitride film 3 is removed by dry etching to expose first copper interconnection 1. At this time, etching residue 8 produced according to the reaction of the etching gas and the silicon nitride accumulates on the surface of first copper interconnection 1. Next, referring to FIGS. 2G and 2H, the surface of first copper interconnection 1 is cleaned with the cleaning composition of the present invention. Unlike the conventional cleaning composition, the cleaning composition of the present invention does not corrode the surface of first copper interconnection 1. Next, referring to FIGS. 2H and 2I, copper is filled in via hole 21 and trench 22, and an unnecessary portion thereof is removed to form second copper interconnection 10, as described above. The cleaning composition of the present invention does not cause corrosion of the surface of first copper interconnection 1, and thus, favorable junction between first and second copper interconnections 1 and 10 is ensured, without a problem of increased junction resistance or disconnection. Further, the interval 11 between the copper interconnections is prevented from narrowing, since the cleaning composition of the present invention hardly etches Low-k film 4. Accordingly, the problems such as degradation in characteristics of semiconductor elements and short-circuit between interconnections are avoided.

Hereinafter, the present invention is described in more detail.

Removing efficiency of the resist residue produced by dry etching, removing efficiency of the etching residue produced according to the reaction of etching gas with inorganic film, and corrosion preventing effects on copper film and Low-k film of the resist removing cleaner according to the present invention, were evaluated as follows.

(1) Preparation of Cleaning Composition for Removing Resists

Various cleaning compositions for removing resists were prepared. The resist removing cleaners of Examples 1-21 are examples of the resist removing cleaner-of the first embodiment. Likewise, those of Examples 22-25 correspond to the second embodiment, those of Examples 26-56 correspond to the third embodiment, and those of Examples 57-61 correspond to the fourth embodiment.

For preparation of the respective resist removing cleaner of the first embodiment, the A and B1 components of prescribed mass % as shown in Tables 1-3, and 95 mass % of the total required amount of the D component (water) were mixed together. Nitric acid and propionic acid as the C component were added in small amounts to the mixture, to achieve a prescribed pH. The D component was then added to obtain 100 mass % of the cleaning composition. Each of the resist removing cleaners of the second embodiment was prepared as follows. The A, B1 and E1 components of prescribed mass % as shown in Table 4, and 95 mass % of the total required amount of the D component were mixed together, to which nitric acid and propionic acid as the C component were added in small amounts to achieve a prescribed pH, and the D component was further added to obtain 100 mass % of the cleaning composition. The amount of the C component to be added varied with the pH to be achieved, from 0.3 mass % to 3 mass %.

Each of the resist removing cleaners of the third embodiment was prepared by adding the D component to the A, B2, C1 and E components of prescribed mass % as shown in FIGS. 5-8, to obtain 100 mass % of the cleaning composition, while confirming the pH. Each of the resist removing cleaners of the fourth embodiment was prepared by adding the D component to the A, B2, C1, E and F components of prescribed mass % as shown in FIG. 9, to obtain 100 mass % of the cleaning composition, while confirming the pH.

(2) Removing Efficiency of Resist Residue

Referring to FIG. 1A, embedded-type first copper interconnection 1 was formed in the silicon oxide film as first insulating film 2 using a common damascene process. Silicon nitride film 3 of a film thickness of 60 nm as the protective film of the first copper interconnection, and a CVD-SiON film (dielectric constant: 2.8) of a film thickness of 600 nm as Low-k film 4, were successively formed thereon. A patterned positive resist film 5 of a film thickness of 400 nm was further formed thereon. Here, the chemically amplified ArF excimer resist including acrylic resin, PAR-101 (manufactured by Sumitomo Chemical Co., Ltd.), was employed as the ArF resist. As the KrF resist, the chemically amplified KrF excimer resist including phenol resin, SEPR-430 (manufactured by Shin-Etsu Chemical Co., Ltd.), was employed.

Next, referring to FIG. 1B, the CVD-SiON film as Low-k film 4 was subjected to dry etching, using a parallel plate RIE at processing pressure of 10 Pa with RF power of 300 W by a mixed gas of fluorocarbon and Ar, to form via hole 21 to expose silicon nitride film 3. At this time, resist residue 6 accumulated in the via hole.

Next, referring to FIG. 1C, the resist pattern after dry etching was subjected to ashing by plasma using oxygen gas, at a room temperature for 90 seconds. At this time, modified layer 7 was formed at the surface of Low-k film 4, and resist residue 6 accumulated on its surface and in via hole 21.

Next, a chip (of a size of 20 mm×20 mm) to which the above resist residue was adhered, was immersed in 200 cm$^3$ of the resist removing cleaner having a composition as shown in Table 1, 2, 4, 5, 6, 8 or 9, at 24° C. for 30 minutes. It was dried after water washing. The removing efficiency of the ArF resist and its resist residue and the removing efficiency of the KrF resist and its resist residue at the time when the resist removing cleaner of the first embodiment was used, are shown in Table 1 and Table 2, respectively. The removing efficiency of the ArF resist and its resist residue at the time when the resist removing cleaner of the second embodiment was used, is shown in Table 4. Further, the removing efficiency of the ArF resist and its resist residue and the removing efficiency of the KrF resist and its resist residue at the time when the resist removing cleaner of the third embodiment was used, are shown in Tables 5 and 8 and Tables 6 and 8, respectively. Still further, the removing efficiency of the ArF resist and its resist residue and the removing efficiency of the KrF resist and its resist residue at the time when the resist removing cleaner of the fourth embodiment was used, are shown in Table 9. In each table, OO and O indicate that resist residue was not found (OO having the surface condition better than that of O), and x indicates that resist residue was found.

Thereafter, referring to FIGS. 1E-1G, trench 22 was formed in Low-k film 4 in the same manner as described above, and, referring to FIGS. 1G and 1H, the remaining resist residue was removed, again in the same manner as above. The resist removing efficiency at this time was the same as in Table 1, 2, 4, 5, 6, 8 or 9.

(3) Removing Efficiency of Reaction Residue of Etching Gas and Inorganic Film

Thereafter, referring to FIG. 1I, silicon nitride film 3 was dry etched using a parallel plate RIE, at processing pressure of 10 Pa with RF power of 300 W by a mixed gas of fluorocarbon and Ar, to expose first copper interconnection 1. At this time, etching residue 8 produced according to the reaction of the etching gas with the silicon nitride film during the dry etching accumulated on the surface of the first copper interconnection.

Figure 1J:
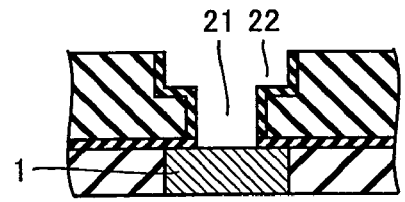

Next, referring to FIGS. 1I and 1J, etching residue 8 was removed using the resist removing cleaner having the composition as shown in Table 3, 7, 8 or 9, in the same manner as in (2) above. The result is shown in the corresponding table. OO, O and x in Tables 3, 7, 8 and 9 are used on the same basis as in Table 1 and others.

Figure 1K:
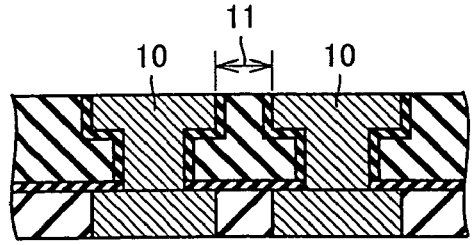

Thereafter, referring to FIG. 1K, copper was filled in via hole 21 and trench 22 by electroplating, and an unnecessary portion thereof was removed by CMP. Second copper interconnection 10 was thus formed.

(4) Corrosion Resistance of Copper Interconnection

To evaluate the corrosion resistance of the copper interconnection, an etched amount (or a decrease in thickness) of a copper plate chip (of a size of 20 mm×20 mm, with a thickness of 500 nm), when it was immersed in the resist removing cleaner having a composition as shown in Tables 1-9 at 24° C. for 30 minutes and dried after water washing, was measured using a film thickness measuring device employing fluorescent X rays, 4 Probe (available from Four Dimension, Inc.). In Tables 1-9, OO indicates that the etched amount was less than 1 nm, O indicates that the etched amount was less than 2 nm, and x indicates that the etched amount was 2 nm or greater.

(5) Corrosion Resistance of Low-k Film

To evaluate the corrosion resistance of the Low-k film, an etched amount (or a decrease in thickness) of a CVD-SiON film chip (of a size of 20 mm×20 mm, with a thickness of 500 nm), when the chip was immersed in the resist removing cleaner having a composition as shown in Tables 1-9 at 24° C. for 30 minutes and dried after water washing, was measured using a film thickness measuring device of an optical interference type, NanoSpec (available from Nanometrics, Inc.). In Tables 1-9, OO indicates that the etched amount was less than 1 nm, O indicates that the same was less than 2 nm, and x indicates that the same was at least 2 nm.

In Tables 1-9, NH$_4$F represents ammonium fluoride, DMAC represents N,N-dimethyl acetamide, DGBE represents diethylene glycol monobutyl ether, DMSO represents dimethyl sulfoxide, DGME represents diethylene glycol monomethyl ether, MDP represents methylene diphosphonic acid, DEEA represents N,N-diethyl ethanol amine, DMAC represents N,N-dimethyl acetamide, PGME represents propylene glycol monomethyl ether, PGBE represents propylene glycol monobuthyl ether, MEA represents monoethanol amine, and BTA represents benzotriazole.

TABLE 1

|  | Comp. Ex. 1 | Ex. 1 | Ex. 2 | Ex. 3 | Ex. 4 | Comp. Ex. 2 | Comp. Ex. 3 | Ex. 5 | Ex. 3 | Ex. 6 | Ex. 7 | Ex. 8 |
| --- | --- | --- | --- | --- | --- | --- | --- | --- | --- | --- | --- | --- |
| A component: $NH_4F$ (mass %) | 0.0 | 0.1 | 0.1 | 0.1 | 0.5 | 0.1 | 0.1 | 0.1 | 0.1 | 0.1 | 0.1 | 0.1 |
| B1 component: |  |  |  |  |  |  |  |  |  |  |  |  |
| DMAC + DGBE (mass %) | 80 | 80 | 80 | 80 | 80 | 80 | 80 | 80 | 80 | 80 | 80 | 80 |
| DMAC mixed mass ratio | 0.3 | 0.3 | 0.3 | 0.3 | 0.3 | 0.3 | 0.3 | 0 | 0.3 | 0.5 | 0.7 | 1 |
| DGBE mixed mass ratio | 0.7 | 0.7 | 0.7 | 0.7 | 0.7 | 0.7 | 0.7 | 1 | 0.7 | 0.5 | 0.3 | 0 |
| pH | 6.5 | 5.5 | 6.5 | 7.5 | 6.5 | 3.5 | 8.5 | 7.5 | 7.5 | 7.5 | 7.5 | 7.5 |
| ArF resist removing efficiency | X | ○ | ○ | ○○ | ○○ | X | ○○ | ○○ | ○○ | ○○ | ○ | ○ |
| Cu film corrosion resistance | ○ | ○ | ○ | ○ | ○ | X | X | ○ | ○ | ○ | ○ | ○ |
| Low-k film corrosion resistance | ○ | ○ | ○ | ○ | ○ | ○ | X | ○ | ○ | ○ | ○ | ○ |

The resist removing cleaners in Examples 1-8 each include all of the A, B1, C and D components, and its pH is within the range of 4-8. Thus, each cleaner exhibits excellent ArF resist removing efficiency, and excellent corrosion preventing effects on the Cu film and the Low-k film. By comparison, Comparative Example 1 does not include the A component, so that the ArF resist removing efficiency became poor. Comparative Example 2 has its pH less than 4, so that the ArF resist removing efficiency and the corrosion resistance of the Cu film were degraded. Comparative Example 3 has its pH exceeding 8, so that the corrosion resistance of both the Cu film and the Low-k film was degraded.

It is found from Examples 3 and 5-8 that the ArF resist containing acrylic resin in large amount and its residue are removed more efficiently as the content of diethylene glycol monobutyl ether within the B1 component is increased.

The resist removing cleaners in Examples 9-16 each include all of the A, B1, C and D components, and its pH is within the range of 4-8. Thus, each cleaner exhibits excellent KrF resist removing efficiency, and excellent corrosion preventing effects on the Cu film and the Low-k film. By comparison, Comparative Example 4 does not include the A component, so that it exhibited poor KrF resist removing efficiency. Comparative Example 5 has its pH less than 4, so that the corrosion resistance of the Cu film was degraded. Comparative Example 6 has its pH exceeding 8, so that its KrF resist removing efficiency and the corrosion preventing effects on the Cu film and the Low-k film were all degraded.

It is found from Examples 10 and 13-16 that the KrF resist containing phenol resin in large amount and its residue can be removed more efficiently as the content of N,N-dimethyl acetamide within the B1 component is increased.

TABLE 2

|  | Comp. Ex. 4 | Ex. 9 | Ex. 10 | Ex. 11 | Ex. 12 | Comp. Ex. 5 | Comp. Ex. 6 | Ex. 13 | Ex. 10 | Ex. 14 | Ex. 15 | Ex. 16 |
| --- | --- | --- | --- | --- | --- | --- | --- | --- | --- | --- | --- | --- |
| A component: $NH_4F$ (mass %) | 0.0 | 0.1 | 0.1 | 0.1 | 0.5 | 0.1 | 0.1 | 0.1 | 0.1 | 0.1 | 0.1 | 0.1 |
| B1 component: |  |  |  |  |  |  |  |  |  |  |  |  |
| DMAC + DGBE (mass %) | 80 | 80 | 80 | 80 | 80 | 80 | 80 | 80 | 80 | 80 | 80 | 80 |
| DMAC mixed mass ratio | 0.7 | 0.7 | 0.7 | 0.7 | 0.7 | 0.7 | 0.7 | 1 | 0.7 | 0.5 | 0.3 | 0 |
| DGBE mixed mass ratio | 0.3 | 0.3 | 0.3 | 0.3 | 0.3 | 0.3 | 0.3 | 0 | 0.3 | 0.5 | 0.7 | 1 |
| pH | 7.0 | 5.5 | 6.5 | 7.5 | 7.0 | 3.5 | 8.5 | 6.5 | 6.5 | 6.5 | 6.5 | 6.5 |
| KrF resist removing efficiency | X | ○○ | ○○ | ○○ | ○○ | ○○ | X | ○○ | ○○ | ○○ | ○○ | ○ |
| Cu film corrosion resistance | ○ | ○ | ○ | ○ | ○ | X | X | ○ | ○ | ○ | ○ | ○ |
| Low-k film corrosion resistance | ○ | ○ | ○ | ○ | ○ | ○ | X | ○ | ○ | ○ | ○ | ○ |

TABLE 3

|  | Comp. Ex. 7 | Ex. 17 | Ex. 18 | Ex. 19 | Ex. 20 | Ex. 21 | Comp. Ex. 8 | Comp. Ex. 9 |
| --- | --- | --- | --- | --- | --- | --- | --- | --- |
| A component: $NH_4F$ (mass %) | 0.0 | 0.1 | 0.1 | 0.1 | 0.1 | 0.5 | 0.1 | 0.1 |
| B1 component: |  |  |  |  |  |  |  |  |
| DMAC + DGBE (mass %) | 80 | 80 | 80 | 80 | 80 | 80 | 80 | 80 |
| DMAC mixed mass ratio | 0.3 | 0.3 | 0.3 | 0.3 | 0.7 | 0.3 | 0.3 | 0.3 |

TABLE 3-continued

|  | Comp. Ex. 7 | Ex. 17 | Ex. 18 | Ex. 19 | Ex. 20 | Ex. 21 | Comp. Ex. 8 | Comp. Ex. 9 |
|---|---|---|---|---|---|---|---|---|
| DGBE mixed mass ratio | 0.7 | 0.7 | 0.7 | 0.7 | 0.3 | 0.7 | 0.7 | 0.7 |
| pH | 6.5 | 5.5 | 6.5 | 7.5 | 7.5 | 6.5 | 3.5 | 8.5 |
| Etching residue removing efficiency | X | ○ | ○ | ○ | ○ | ○○ | ○ | ○ |
| Cu film corrosion resistance | ○ | ○ | ○ | ○ | ○ | ○ | X | X |
| Low-k film corrosion resistance | ○ | ○ | ○ | ○ | ○ | ○ | ○ | X |

The resist removing cleaners in Examples 17-21 each include all of the A, B1, C and D components, and its pH is within the range of 4-8. Thus, each cleaner exhibits excellent etching residue removing efficiency, and excellent corrosion preventing effects on the Cu film and the Low-k film. Although the etching residue does not include the resist or the resist residue as above, it includes a large amount of carbon residue derived from the etching gas, so that the resist removing cleaner according to the present invention is applicable.

Comparative Example 7 does not include the A component, so that it exhibited poor etching residue removing efficiency. Comparative Example 8 has its pH less than 4, so that the corrosion resistance of the Cu film was degraded. Comparative Example 9 has its pH greater than 8, so that the corrosion resistance of both the Cu film and the Low-k film was degraded.

TABLE 4

|  |  | Ex. 22 | Ex. 23 | Ex. 24 | Ex. 25 |
|---|---|---|---|---|---|
| A component: $NH_4F$ | (mass %) | 0.1 | 0.1 | 0.1 | 0.1 |
| B1 component: |  |  |  |  |  |
| DMAC + DGBE | (mass %) | 80 | 80 | 80 | 80 |
| DMAC mixed mass ratio |  | 0.3 | 0.5 | 0.3 | 0.5 |
| DGBE mixed mass ratio |  | 0.7 | 0.5 | 0.7 | 0.5 |
| E1 component: |  |  |  |  |  |
| Ammonium acetate | (mass %) | 1.5 | 1.5 | — | — |
| Ammonium sulfamate | (mass %) | — | — | 1.5 | 1.5 |

TABLE 4-continued

|  | Ex. 22 | Ex. 23 | Ex. 24 | Ex. 25 |
|---|---|---|---|---|
| pH | 7.5 | 7.5 | 7.5 | 7.5 |
| ArF resist removing efficiency | ○○ | ○○ | ○○ | ○○ |
| Cu film corrosion resistance | ○ | ○ | ○ | ○ |
| Low-k film corrosion resistance | ○ | ○ | ○ | ○ |

The resist removing cleaners in Examples 22-25 each include all of the A, B1, C, D and E1 components, and its pH is within the range of 4-8. Thus, each cleaner exhibits excellent ArF resist removing efficiency, and excellent corrosion preventing effects on the Cu film and the Low-k film. It was also found that the corrosion resistance of the Low-k film would further improve compared to Examples 3 and 6 not containing the E1 component, although they were indicated by the same symbol of ○ in the Tables. Such tendency was found not only in the removing efficiency of the ArF resist and its resist residue, but also in the removing efficiency of the KrF resist and its resist residue.

TABLE 5

|  | Comp. Ex. 10 | Ex. 26 | Ex. 27 | Ex. 28 | Ex. 29 | Comp. Ex. 11 | Comp. Ex. 12 | Ex. 30 | Ex. 27 | Ex. 31 | Ex. 32 | Ex. 33 | Ex. 34 | Ex. 35 |
|---|---|---|---|---|---|---|---|---|---|---|---|---|---|---|
| A component: $NH_4F$ (mass %) | 0.0 | 0.1 | 0.1 | 0.1 | 0.1 | 0.1 | 0.1 | 0.1 | 0.1 | 0.1 | 0.1 | 0.1 | 0.1 | 0.1 |
| B2 component: |  |  |  |  |  |  |  |  |  |  |  |  |  |  |
| DMSO + DGME (mass %) | 70 | 70 | 70 | 70 | 70 | 70 | 70 | 70 | 70 | 70 | 70 | 70 | 80 | 60 |
| DMSO mixed mass ratio | 0.3 | 0.3 | 0.3 | 0.3 | 0.3 | 0.3 | 0.3 | 0.0 | 0.3 | 0.5 | 0.7 | 1.0 | 0.3 | 0.3 |
| DGME mixed mass ratio | 0.7 | 0.7 | 0.7 | 0.7 | 0.7 | 0.7 | 0.7 | 1.0 | 0.7 | 0.5 | 0.3 | 0.0 | 0.7 | 0.7 |
| C1 component: MDP (mass %) | 5 | 5 | 5 | 5 | 6 | 7 | 5 | 5 | 5 | 5 | 5 | 5 | 5 | 10 |
| E component: DEEA (mass %) | 3 | 1.5 | 3 | 5 | 5 | 1 | 7 | 3 | 3 | 3 | 3 | 3 | 3 | 7 |

TABLE 5-continued

|  | Comp. Ex. 10 | Ex. 26 | Ex. 27 | Ex. 28 | Ex. 29 | Comp. Ex. 11 | Comp. Ex. 12 | Ex. 30 | Ex. 27 | Ex. 31 | Ex. 32 | Ex. 33 | Ex. 34 | Ex. 35 |
|---|---|---|---|---|---|---|---|---|---|---|---|---|---|---|
| pH | 6.0 | 3.0 | 6.0 | 7.5 | 6.0 | 1.5 | 8.5 | 6.0 | 6.0 | 6.0 | 6.0 | 6.0 | 6.0 | 6.0 |
| ArF resist removing efficiency | X | ○ | ○○ | ○○ | ○○ | ○ | ○ | ○○ | ○○ | ○○ | ○○ | ○ | ○○ | ○○ |
| Cu film corrosion resistance | ○ | ○ | ○ | ○ | ○ | X | X | ○ | ○ | ○ | ○ | ○ | ○ | ○ |
| Low-k film corrosion resistance | ○○ | ○○ | ○○ | ○○ | ○○ | ○○ | X | ○○ | ○○ | ○○ | ○○ | ○○ | ○○ | ○○ |

The resist removing cleaners in Examples 26-35 each include all of the A, B2, C1, D and E components, and its pH is within the range of 2-8. Thus, each cleaner exhibits excellent ArF resist removing efficiency, and excellent corrosion preventing effects on the Cu film and the Low-k film. By comparison, Comparative Example 10 does not include the A component, so that the ArF resist removing efficiency became poor. Comparative Example 11 has its pH less than 2, so that the corrosion resistance of the Cu film was degraded. Comparative Example 12 has its pH exceeding 8, so that the corrosion resistance of both the Cu film and the Low-k film was degraded.

It is found from Examples 27 and 30-33 that the ArF resist containing acrylic resin in large amount and its residue are removed more efficiently as the content of diethylene glycol monomethyl ether within the B2 component is increased.

The resist removing cleaners in Examples 36-45 each include all of the A, B2, C1, D and E components, and its pH is within the range of 2-8. Thus, each cleaner exhibits excellent KrF resist removing efficiency, and excellent corrosion preventing effects on the Cu film and the Low-k film. By comparison, Comparative Example 13 does not include the A component, so that it exhibited poor KrF resist removing efficiency. Comparative Example 14 has its pH less than 2, so that the corrosion resistance of the Cu film was degraded. Comparative Example 15 has its pH exceeding 8, so that its KrF resist removing efficiency and the corrosion preventing effects on the Cu film and the Low-k film were all degraded.

It is found from Examples 37 and 40-43 that the KrF resist containing phenol resin in large amount and its residue can be removed more efficiently as the content of dimethyl sulfoxide within the B2 component is increased.

TABLE 6

|  | Comp. Ex. 13 | Ex. 36 | Ex. 37 | Ex. 38 | Ex. 39 | Comp. Ex. 14 | Comp. Ex. 15 | Ex. 40 | Ex. 41 | Ex. 42 | Ex. 37 | Ex. 43 | Ex. 44 | Ex. 45 |
|---|---|---|---|---|---|---|---|---|---|---|---|---|---|---|
| A component: NH$_4$F (mass %) | 0.0 | 0.1 | 0.1 | 0.1 | 0.5 | 0.1 | 0.1 | 0.1 | 0.1 | 0.1 | 0.1 | 0.1 | 0.1 | 0.1 |
| B2 component: |  |  |  |  |  |  |  |  |  |  |  |  |  |  |
| DMSO + DGME (mass %) | 70 | 70 | 70 | 70 | 70 | 70 | 70 | 70 | 70 | 70 | 70 | 70 | 80 | 60 |
| DMSO mixed mass ratio | 0.7 | 0.7 | 0.7 | 0.7 | 0.7 | 0.7 | 0.7 | 0.0 | 0.3 | 0.5 | 0.7 | 1.0 | 0.7 | 0.7 |
| DGME mixed mass ratio | 0.3 | 0.3 | 0.3 | 0.3 | 0.3 | 0.3 | 0.3 | 1.0 | 0.7 | 0.5 | 0.3 | 0.0 | 0.3 | 0.3 |
| C1 component: MDP (mass %) | 5 | 5 | 5 | 5 | 6 | 7 | 5 | 5 | 5 | 5 | 5 | 5 | 5 | 10 |
| E component: DEEA (mass %) | 3 | 1.5 | 3 | 5 | 5 | 1 | 7 | 3 | 3 | 3 | 3 | 3 | 3 | 7 |
| pH | 6.0 | 3.0 | 6.0 | 7.5 | 6.0 | 1.5 | 8.5 | 6.0 | 6.0 | 6.0 | 6.0 | 6.0 | 6.0 | 6.0 |
| KrF resist removing efficiency | X | ○○ | ○○ | ○ | ○○ | ○○ | X | ○ | ○○ | ○○ | ○○ | ○○ | ○○ | ○○ |
| Cu film corrosion resistance | ○ | ○ | ○ | ○ | ○ | X | X | ○ | ○ | ○ | ○ | ○ | ○ | ○ |
| Low-k film corrosion resistance | ○○ | ○○ | ○○ | ○○ | ○○ | ○○ | X | ○○ | ○○ | ○○ | ○○ | ○○ | ○ | ○○ |

TABLE 7

|  | Comp. Ex. 16 | Ex. 46 | Ex. 47 | Ex. 48 | Ex. 49 | Ex. 50 | Comp. Ex. 17 | Comp Ex. 18 |
|---|---|---|---|---|---|---|---|---|
| A component: NH$_4$F (mass %) | 0.0 | 0.1 | 0.1 | 0.1 | 0.1 | 0.5 | 0.1 | 0.1 |
| B2 component: |  |  |  |  |  |  |  |  |
| DMSO + DGME (mass %) | 70 | 70 | 70 | 70 | 70 | 70 | 70 | 70 |
| DMSO mixed mass ratio | 0.3 | 0.3 | 0.3 | 0.7 | 0.7 | 0.3 | 0.3 | 0.3 |
| DGME mixed mass ratio | 0.7 | 0.7 | 0.7 | 0.3 | 0.3 | 0.7 | 0.7 | 0.7 |
| C1 component: MDP (mass %) | 5 | 5 | 5 | 5 | 10 | 5 | 7 | 5 |
| E component: DEEA (mass %) | 3 | 1.5 | 3 | 3 | 7 | 3.5 | 1 | 7 |
| pH | 6.0 | 3.0 | 6.0 | 6.0 | 6.0 | 6.5 | 1.5 | 8.5 |

TABLE 7-continued

|  | Comp. Ex. 16 | Ex. 46 | Ex. 47 | Ex. 48 | Ex. 49 | Ex. 50 | Comp. Ex. 17 | Comp Ex. 18 |
|---|---|---|---|---|---|---|---|---|
| Etching residue removing efficiency | X | ⊚ | ⊚ | ⊚ | ⊚ | ⊚ | X | ○ |
| Cu film corrosion resistance | ○ | ○ | ○ | ○ | ○ | ○ | X | X |
| Low-k film corrosion resistance | ⊚ | ⊚ | ⊚ | ⊚ | ⊚ | ⊚ | ○ | X |

The resist removing cleaners in Examples 46-50 each include all of the A, B2, C1, D and E components, and its pH is within the range of 2-8. Thus, each cleaner exhibits excellent etching residue removing efficiency, and excellent corrosion preventing effects on the Cu film and the Low-k film. Although the etching residue does not include the resist or the resist residue as above, it includes a large amount of carbon residue derived from the etching gas, so that the resist removing cleaner according to the present invention is applicable.

Comparative Example 16 does not include the A component, so that it exhibited poor etching residue removing efficiency. Comparative Example 17 has its pH less than 2, so that the etching residue removing efficiency and the corrosion resistance of the Cu film were degraded. Comparative Example 18 has its pH greater than 8, so that the corrosion resistance of both the Cu film and the Low-k film was degraded.

TABLE 8

|  | Ex. 51 | Ex. 52 | Ex. 53 | Ex. 54 | Ex. 55 | Ex. 56 | Comp. Ex. 19 | Comp. Ex. 20 |
|---|---|---|---|---|---|---|---|---|
| A component: $NH_4F$ (mass %) | 0.1 | 0.1 | 0.1 | 0.1 | 0.1 | 0.1 | 0.1 | 0.1 |
| B2 component: |  |  |  |  |  |  |  |  |
| B2 component (mass %) | 70 | 70 | 70 | 70 | 70 | 70 | 70 | 70 |
| DMSO mixed mass ratio | 0.3 | 0.3 | 0.3 | 0.3 |  | 0.3 | 0.3 | 0.3 |
| DMAC mixed mass ratio |  |  |  |  | 0.3 |  |  |  |
| DGME mixed mass ratio | 0.7 |  |  |  | 0.7 | 0.7 | 0.7 | 0.7 |
| DGBE mixed mass ratio |  | 0.7 |  |  |  |  |  |  |
| PGME mixed mass ratio |  |  | 0.7 |  |  |  |  |  |
| PGBE mixed mass ratio |  |  |  | 0.7 |  |  |  |  |
| C1 component: MDP (mass %) | 5 | 5 | 5 | 5 | 5 | 5 | 7 | 5 |
| E component: | DEEA | DEEA | DEEA | DEEA | DEEA | MEA | DEEA | DEEEA |
| name of compound (mass %) | 3 | 3 | 3 | 3 | 3 | 2.5 | 1 | 7 |
| pH | 6.0 | 6.0 | 6.0 | 6.0 | 6.0 | 6.0 | 1.5 | 8.5 |
| ArF resist removing efficiency | ⊚ | ⊚ | ⊚ | ⊚ | ⊚ | ⊚ | ○ | ⊚ |
| KrF resist removing efficiency | ⊚ | ⊚ | ⊚ | ⊚ | ⊚ | ⊚ | ⊚ | X |
| Etching residue removing efficiency | ⊚ | ⊚ | ⊚ | ⊚ | ⊚ | ⊚ | ⊚ | ⊚ |
| Cu film corrosion resistance | ○ | ○ | ○ | ○ | ○ | ○ | X | X |
| Low-k film corrosion resistance | ⊚ | ⊚ | ⊚ | ⊚ | ⊚ | ⊚ | ⊚ | X |

The resist removing cleaners in Examples 51-56 each include all of the A, B2, C1, D and E components, and its pH is within the range of 2-8. Thus, each cleaner exhibits excellent removing efficiency of ArF resist, KrF resist and etching residue, and also exhibits excellent corrosion preventing effects on the Cu film and the Low-k film. The relevant examples show that a mixture of sulfur-containing compound (e.g., dimethyl sulfoxide) or amines (e.g., N,N-dimethyl acetamide) and polyhydric alcohol or its derivative (e.g., diethylene glycol monomethyl ether, diethylene glycol monobutyl ether) is preferable as the B2 component.

TABLE 9

|  | Comp. Ex. 21 | Ex. 57 | Ex. 58 | Ex. 59 | Ex. 60 | Ex. 61 | Comp. Ex. 22 | Comp. Ex. 23 |
| --- | --- | --- | --- | --- | --- | --- | --- | --- |
| A component: $NH_4F$ (mass %) | 0.0 | 0.1 | 0.1 | 0.1 | 0.1 | 0.1 | 0.1 | 0.1 |
| B2 component: |  |  |  |  |  |  |  |  |
| DMSO + DGME (mass %) | 70 | 70 | 70 | 70 | 70 | 70 | 70 | 70 |
| DMSO mixed mass ratio | 0.3 | 0.3 | 0.3 | 0.3 | 0.3 | 0.3 | 0.3 | 0.3 |
| DGME mixed mass ratio | 0.7 | 0.7 | 0.7 | 0.7 | 0.7 | 0.7 | 0.7 | 0.7 |
| C1 component: MDP (mass %) | 5 | 5 | 5 | 5 | 5 | 5 | 7 | 5 |
| E component: DEEA (mass %) | 3 | 1.5 | 3 | 3 | 3 | 3 | 1 | 7 |
| F component: name of compound (mass %) | BTA 1 | BTA 1 | BTA 1 | Oxalic acid 1 | Benzoic acid 1 | Glycine 1 | BTA 1 | BTA 1 |
| pH | 6.0 | 3.0 | 6.0 | 6.0 | 6.0 | 6.0 | 1.5 | 8.5 |
| ArF resist removing efficiency | X | ○ | ○○ | ○○ | ○○ | ○○ | ○ | ○ |
| KrF resist removing efficiency | X | ○○ | ○○ | ○○ | ○○ | ○○ | ○○ | X |
| Etching residue removing efficiency | X | ○○ | ○○ | ○○ | ○○ | ○○ | X | ○ |
| Cu film corrosion resistance | ○○ | ○○ | ○○ | ○○ | ○○ | ○○ | X | X |
| Low-k film corrosion resistance | ○○ | ○○ | ○○ | ○○ | ○○ | ○○ | ○○ | X |

The resist removing cleaners in Examples 57-61 each include all of the A, B2, C1, D, E and F components, and its pH is within the range of 2-8. Thus, each cleaner exhibits excellent removing efficiency of ArF resist, KrF resist and etching residue, and also exhibits excellent corrosion preventing effects on the Cu film and the Low-k film. Although the etching residue does not include the resist or the resist residue as above, it includes a large amount of carbon residue derived from the etching gas, so that the resist removing cleaner according to the present invention is applicable.

Comparative Example 21 does not include the A component, so that it exhibited poor removing efficiency of ArF resist, KrF resist and etching residue. Comparative Example 22 has its pH less than 2, so that the etching residue removing efficiency and the corrosion resistance of the Cu film were degraded. Comparative Example 23 has its pH greater than 8, so that the KrF resist removing efficiency and corrosion resistance of both the Cu film and the Low-k film were degraded.

Although the present invention has been described and illustrated in detail, it is clearly understood that the same is by way of illustration and Ex. only and is not to be taken by way of limitation, the spirit and scope of the present invention being limited only by the terms of the appended claims.

What is claimed is:

1. A cleaning composition for removing KrF excimer resist or ArF excimer resist from a substrate including a copper film, comprising a salt of hydrofluoric acid and a base not containing a metal (A component), a water-soluble organic solvent that is a mixture of amides and polyhydric alcohol or its derivatives (B1 component), at least one acid selected from the group consisting of formic acid, acetic acid, propionic acid, butyric acid, oxalic acid, glycolic acid, tartaric acid, citric acid, benzoic acid, toluic acid, phthalic acid, sulfuric acid, hydrochloric acid, nitric acid and phosphoric acid (C component), water (D component), and an ammonium salt which is selected from the group consisting of aliphatic monocarboxylic acid ammonium salt, aliphatic polycarboxylic acid ammonium salt, oxycarboxylic acid ammonium salt and amino phosphonic acid ammonium salt (E1 component), the content of said salt of hydrofluoric acid and a base not containing a metal (the A component) being 0.01-1 mass % and said cleaning composition having a pH of 4-8.

2. The cleaning composition for removing resists according to claim 1, wherein the base not containing a metal for forming the salt of hydrofluoric acid and a base not containing a metal (the A component) is at least one base selected from the group consisting of an organic amine compound, ammonia, and a lower quaternary ammonium base.

3. A cleaning composition for removing KrF excimer resist or ArF excimer resist from a substrate including a copper film, comprising a salt of hydrofluoric acid and a base not containing a metal (A component), a water-soluble organic solvent that is a mixture of a sulfur-containing compound and polyhydric alcohol or its derivatives (B2 component), 1-hydroxyl ethylidene-1,1-diphosphonic acid (C1 component), water (D component), and a base not containing a metal which is selected from the group consisting of hydroxy amines, primary fatty amine, secondary fatty amine, tertiary fatty amine, alicyclic amine, heterocycle amine, aromatic amine, ammonia and lower quaternary ammonium base (E component), the content of said salt of hydrofluoric acid and a base not containing a metal (the A component) being 0.01-1 mass %, the content of said phosphonic acid (the C1 component) being 0.1-20 mass %, the content of said base not containing a metal (the E component) being 0.1-20 mass %, and said cleaning composition having a pH of 2-8.

4. A cleaning composition for removing KrF excimer resist or ArF excimer resist from a substrate including a copper film, comprising a salt of hydrofluoric acid and a base not containing a metal (A component), a water-soluble organic solvent that is a mixture of a sulfur-containing compound and polyhydric alcohol or its derivatives (B2 component), 1-hydroxyl ethylidene-1,1-diphosphonic acid (C1 component), water (D component), a base not containing a metal which is selected from the group consisting of hydroxy amines, primary fatty amine, secondary fatty amine, tertiary fatty amine, alicyclic amine, heterocycle amine, aromatic amine, ammonia and lower quaternary ammonium base (E component), and a Cu corrosion inhibitor (F component), the content of said salt of hydrofluoric acid and a base not containing a metal (the A component) being 0.01-1 mass %, the content of said phosphonic acid (the C1 component) being 0.1-20 mass %, the content of said base not containing a metal (the E component) being 0.1-20 mass %, and said cleaning composition has a pH of 2-8.

5. The cleaning composition for removing resists according to claim 4, wherein the Cu corrosion inhibitor (the F component) includes at least one selected from the group consisting of triazoles, aliphatic carboxylic acids, aromatic carboxylic acids, and amino carboxylic acids.

6. A method of manufacturing a semiconductor device, comprising:
    forming a metal film having copper as its main component on a semiconductor substrate;
    forming an insulating film on the metal film;
    forming a resist film on the insulating film;
    forming a hole or a trench in the insulating film by dry etching, using the resist film as a mask;
    removing the resist film by gas plasma processing or heat treatment; and
    removing remaining resist residue using the cleaning composition for removing resists according to claim 1.

7. The method according to claim 6, wherein the resist film used as the mask in the dry etching is a chemically amplified excimer resist.

8. A method of manufacturing a semiconductor device, comprising:
    forming a metal film having copper as its main component on a semiconductor substrate;
    forming an insulating film on the metal film;
    forming a resist film on the insulating film;
    forming a hole or a trench in the insulating film by dry etching, using the resist film as a mask; and
    removing the resist film and resist residue produced during the dry etching using the cleaning composition for removing resists according to claim 1.

9. A method of manufacturing a semiconductor device, comprising:
    forming a metal film having copper as its main component on a semiconductor substrate;
    forming an insulating film on the metal film;
    forming a hole in the insulating film reaching the metal film by dry etching; and
    removing etching residue produced during the dry etching using the cleaning composition for removing resists according to claim 1.

* * * * *